United States Patent
Kuwabara et al.

(10) Patent No.: US 10,935,967 B2
(45) Date of Patent: Mar. 2, 2021

(54) MACHINING EQUIPMENT SYSTEM AND MANUFACTURING SYSTEM

(71) Applicant: FANUC CORPORATION, Yamanashi (JP)

(72) Inventors: Akiyuki Kuwabara, Yamanashi (JP); Norio Takei, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/035,973

(22) Filed: Jul. 16, 2018

(65) Prior Publication Data
US 2019/0033839 A1 Jan. 31, 2019

(30) Foreign Application Priority Data
Jul. 27, 2017 (JP) .............................. JP2017-145401

(51) Int. Cl.
*G05B 19/418* (2006.01)
*G06N 20/00* (2019.01)
(Continued)

(52) U.S. Cl.
CPC ...... *G05B 19/41875* (2013.01); *B23K 26/032* (2013.01); *B25J 9/163* (2013.01);
(Continued)

(58) Field of Classification Search
CPC .... H05K 13/0812; B23K 26/032; G06N 3/08; G06N 3/084; G06N 20/00; G06N 7/005;
(Continued)

(56) References Cited

U.S. PATENT DOCUMENTS

| 5,473,532 A | 12/1995 | Unno et al. |
| 6,108,887 A * | 8/2000 | Ponamgi .......... G05B 19/41865 29/407.01 |

(Continued)

FOREIGN PATENT DOCUMENTS

| EP | 0467297 A2 | 1/1992 |
| JP | H04-138504 A | 5/1992 |

(Continued)

OTHER PUBLICATIONS

Japanese Office Action dated Apr. 23, 2019, in connection with corresponding JP Application No. 2017-145401 (11 pgs., including English translation).

(Continued)

*Primary Examiner* — Crystal J Barnes-Bullock
(74) *Attorney, Agent, or Firm* — Maier & Maier, PLLC (57) ABSTRACT

Provided is a machining equipment system including machining equipment that performs machining of a workpiece; a control device that controls the machining equipment on the basis of a machining condition; a state obtaining device that obtains a state of the machining equipment during the machining; an inspection device that inspects the workpiece after the machining; and a machine learning device that performs machine learning on the basis of a result of inspection by the inspection device and the state of the machining equipment, obtained by the state obtaining device, wherein the machine learning device modifies the machining condition on the basis of a result of the machine learning so as to improve the machining accuracy of the workpiece or so as to minimize the defect rate of the workpiece.

6 Claims, 7 Drawing Sheets

(51) Int. Cl.
*G06N 7/00* (2006.01)
*G06N 3/00* (2006.01)
*H05K 13/08* (2006.01)
*B23K 26/03* (2006.01)
*B25J 9/16* (2006.01)
*G06N 3/08* (2006.01)
*G06T 7/00* (2017.01)
*G06F 30/20* (2020.01)
*G05B 19/414* (2006.01)

(52) U.S. Cl.
CPC ......... *G05B 19/4183* (2013.01); *G06F 30/20* (2020.01); *G06N 3/006* (2013.01); *G06N 3/08* (2013.01); *G06N 7/005* (2013.01); *G06N 20/00* (2019.01); *G06T 7/0004* (2013.01); *H05K 13/0812* (2018.08); *G05B 19/414* (2013.01); *G05B 2219/33321* (2013.01); *G06T 2207/20081* (2013.01); *G06T 2207/30164* (2013.01)

(58) Field of Classification Search
CPC .............. G06K 9/6262; G06K 2209/19; G06T 7/0004; G06T 2207/20081; G06T 2207/30164; B25J 9/163; G06F 30/20; G05B 19/4063; G05B 2219/33034; G05B 2219/37448; G05B 2219/45066; G05B 19/414; G05B 19/4183; G05B 19/41875; G05B 2219/31102; G05B 2219/33321; G05B 2219/36284
See application file for complete search history.

(56) References Cited

U.S. PATENT DOCUMENTS

| | | | | |
|---|---|---|---|---|
| 7,424,338 | B1 * | 9/2008 | Wipert | B23Q 17/0909 700/175 |
| 7,567,853 | B2 * | 7/2009 | Kreidler | G05B 19/042 700/169 |
| 7,706,595 | B2 * | 4/2010 | Bushman | H05K 13/0812 382/141 |
| 8,995,749 | B2 * | 3/2015 | Bryll | G06T 7/13 382/152 |
| 9,701,019 | B2 * | 7/2017 | Eberst | B25J 9/1664 |
| 2014/0294284 | A1 * | 10/2014 | Bryll | G06T 7/0004 382/152 |
| 2016/0091889 | A1 | 3/2016 | Nakajima et al. | |
| 2017/0031328 | A1 | 2/2017 | Sawada et al. | |
| 2017/0032283 | A1 * | 2/2017 | Kamiya | G01B 21/02 |
| 2017/0060104 | A1 | 3/2017 | Genma | |
| 2017/0270434 | A1 * | 9/2017 | Takigawa | B23K 26/707 |
| 2017/0277174 | A1 | 9/2017 | Maeda | |
| 2017/0293862 | A1 | 10/2017 | Kamiya et al. | |
| 2018/0056520 | A1 * | 3/2018 | Ozaki | G06N 3/084 |
| 2018/0067471 | A1 | 3/2018 | Saitou et al. | |
| 2018/0307203 | A1 * | 10/2018 | Aizawa | G05B 19/41875 |
| 2018/0370027 | A1 * | 12/2018 | Oota | B25J 9/161 |
| 2019/0011898 | A1 * | 1/2019 | Saeki | G05B 19/404 |
| 2019/0370646 | A1 * | 12/2019 | Rana | G06N 3/08 |
| 2020/0051550 | A1 * | 2/2020 | Baker | G10L 21/00 |

FOREIGN PATENT DOCUMENTS

| | | |
|---|---|---|
| JP | H04-354653 A | 12/1992 |
| JP | H05-104395 A | 4/1993 |
| JP | 2004-160564 A | 6/2004 |
| JP | 2006-068901 A | 3/2006 |
| JP | 2016-071407 A | 5/2016 |
| JP | 2017-030067 A | 2/2017 |
| JP | 2017-045300 A | 3/2017 |
| JP | 6140331 B1 | 5/2017 |
| JP | 2017-174236 A | 9/2017 |
| JP | 2018-041208 A | 3/2018 |

OTHER PUBLICATIONS

Japanese Search Report dated Apr. 8, 2019, in connection with corresponding JP Application No. 2017-145401 (32 pgs., including English translation).

* cited by examiner

MACHINING EQUIPMENT SYSTEM AND MANUFACTURING SYSTEM

CROSS-REFERENCE TO RELATED APPLICATIONS

This application is based on Japanese Patent Application No. 2017-145401, the content of which is incorporated herein by reference.

FIELD

The present invention relates to machining equipment systems and manufacturing systems.

BACKGROUND

Generally, in factories in which machining and assembly are performed, machining cells are constructed of machining equipment systems in which different kinds of machining equipment such as working machines, injection molding machines, and industrial robots are combined, and tasks such as machining of a workpiece and welding are performed on a per-machining-cell basis.

In a machining equipment system of this type, in the case where an abnormality is detected in the machined workpiece inspection phase, which results in a need to adjust the machining conditions, it has been necessary to stop the relevant machining equipment and to manually adjust the machining conditions.

Japanese Unexamined Patent Application, Publication No. Hei 5-104395 discloses a product-machining-condition setting device that makes it possible to obtain an amount of deviation between standard information and numerical information representing the machining result of a machined product and to calibrate the machining conditions in real time on the basis of the amount of deviation without having to stop the equipment.

SUMMARY

The present invention provides the following solutions.

A first aspect of the present invention is a machining equipment system including machining equipment that performs machining of a workpiece; a control device that controls the machining equipment on the basis of a machining condition; a state obtaining device that obtains a state of the machining equipment during the machining; an inspection device that inspects the workpiece after the machining; and a machine learning device that performs machine learning on the basis of a result of inspection by the inspection device and the state of the machining equipment, obtained by the state obtaining device, wherein the machine learning device modifies the machining condition on the basis of a result of the machine learning so as to improve the machining accuracy of the workpiece or so as to minimize the defect rate of the workpiece.

A second aspect of the present invention is a manufacturing system including a plurality of machining equipment systems of the type described above, wherein, in the case where a workpiece of the same kind as the workpiece machined by one of the plurality of machining equipment systems is machined by another one of the plurality of machining equipment systems, the machining condition and the inspection result for the workpiece in the one machining equipment system are shared as learning data for the machine learning in the other machining equipment system. This makes it possible to improve the efficiency of learning.

A third aspect of the present invention is a manufacturing system including machining equipment that performs machining of a workpiece; a control device that controls the machining equipment on the basis of a machining condition; a state obtaining device that obtains a state of the machining equipment during the machining and an inspection device that inspects the workpiece after the machining; an evaluation test device that conducts an evaluation test for the workpiece serving as a final product; and a machine learning device that performs machine learning on the basis of a result of the evaluation test by the evaluation test device, a result of inspection by the inspection device, and the state of the machining equipment, obtained by the state obtaining device, wherein the machine learning device modifies the machining condition and an inspection condition in the inspection device on the basis of a result of the machine learning so as to minimize costs of the final product.

DETAILED DESCRIPTION

First Embodiment

A machining equipment system according to a first embodiment of the present invention will be described below in detail with reference to the drawings. Although milling equipment is given as an example of the machining equipment in the description of this embodiment, the machining equipment is not limited to milling equipment and may be an injection molding machine, an arc welding robot, or the like.

Figure 1:
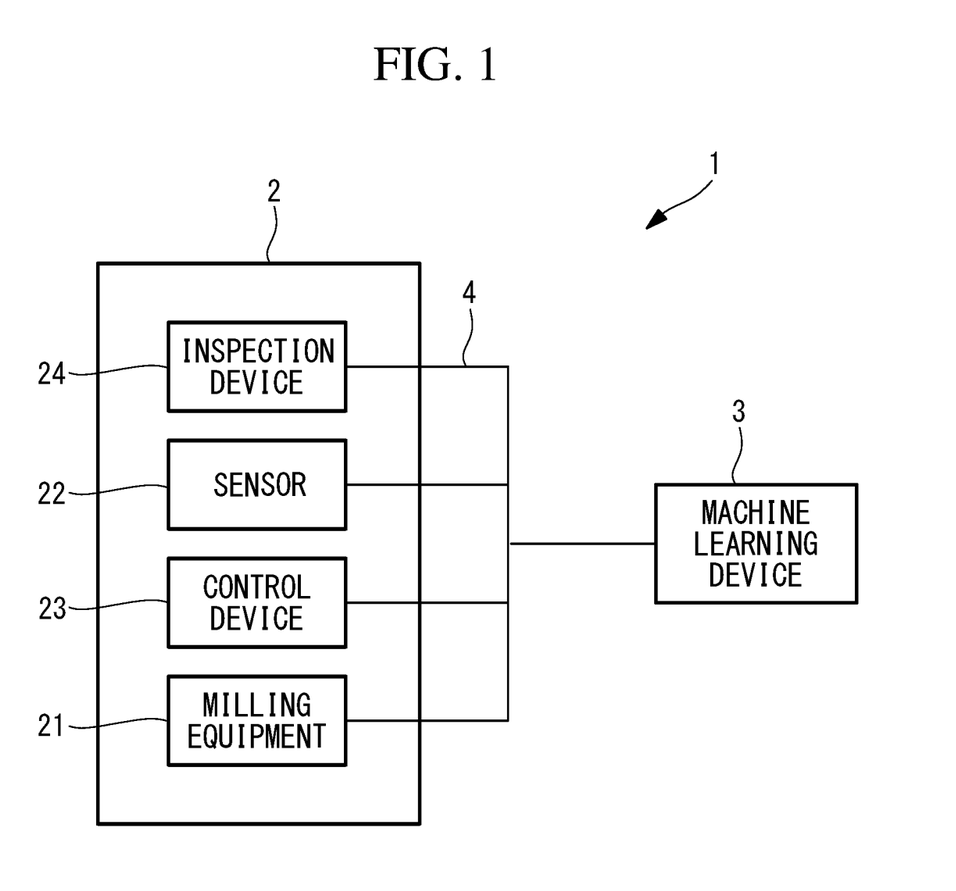
FIG. 1 is a block diagram schematically showing the configuration of a machining equipment system according to a first embodiment of the present invention.

As shown in FIG. 1, a machining equipment system 1 according to this embodiment includes a machining cell 2 including milling equipment (machining equipment) 21 for machining a workpiece, a control device 23 that controls the milling equipment 21, a sensor (state obtaining device) 22 that is attached to the milling equipment 21 and that obtains the states of the milling equipment 21, and an inspection device 24 for inspecting the workpiece after machining, and also includes a machine learning device 3. Each of the milling equipment 21, the sensor 22, the control device 23, and the inspection device 24 included in the machining cell 2 is connected to the machine learning device 3 via a communication network 4, such as an Ethernet (registered trademark) network or an FL-NET network.

In the machining cell 2, the control device 23 controls the milling equipment 21 on the basis of machining conditions determined by the machine learning device 3, whereby a workpiece is machined. The state of the milling equipment 21 during machining is detected by the sensor 22 and is sent to the machine learning device 3 as state data. Meanwhile, the inspection device 24 conducts an inspection of the workpiece that has been machined by the milling equipment 21. In the inspection by the inspection device 24, a machining error is calculated on the basis of design data for the workpiece and the machined workpiece, and the defect rate of the workpiece is determined. Then, inspection result data is sent to the machine learning device 3. Then, in the machine learning device 3, learning is performed on the basis of the state data of the milling equipment 21 and the inspection result data obtained by the inspection device 24.

Figure 7:
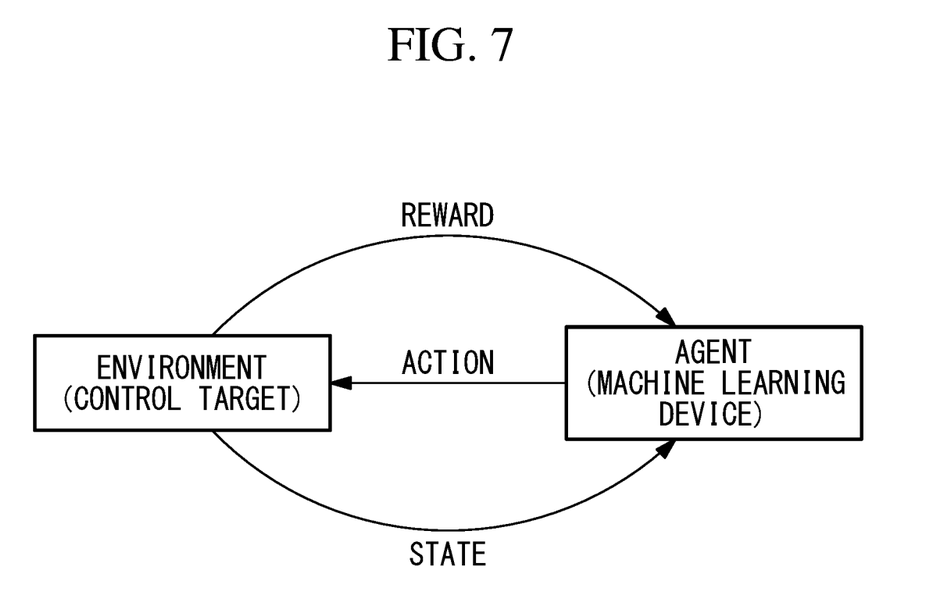
FIG. 7 is an illustration for explaining a framework of reinforcement learning in the first and second embodiments of the present invention.

The machine learning device 3 in this embodiment is configured to perform reinforcement learning. The framework for reinforcement learning consists of an agent, an environment, and interactions between the agent and the environment. FIG. 7 shows the framework of reinforcement learning in the case where a Markov decision process (MDP) is adopted as a mathematical model for describing the interactions.

Although a Markov decision process is adopted as a mathematical model in this embodiment, alternatively, for example, a partially observable Markov process, in which the agent cannot directly receive states, may be adopted.

The agent is an entity that determines actions, and the machine learning device 3 corresponds to the agent in the context of this embodiment. The environment is a circumstance that the agent interacts with, and the milling equipment 21 that is to be controlled corresponds to the environment in the context of this embodiment. The states represent the states of the milling equipment 21, such as the rotation speed and feeding speed of the main shaft, the position and milling load of a tool, external disturbances, and the position of a workpiece. The actions are operations that the machine learning device 3, acting as the agent, performs on the milling equipment 21 that is to be controlled, i.e., machining conditions such as the rotation angle and feeding speed of the main shaft. Rewards are immediate benefits of actions. Rules that are used when the agent determines actions are called policies.

More specifically, the agent and the environment execute the following steps.

Step 1: The agent makes a decision in accordance with a state $s_t$ of the environment observed at a time t and outputs an action $a_t$.

Step 2: The environment makes a state transition to $s_{t+1}$ and gives a reward $r_t$ corresponding to the transition to the agent.

Step 3: The time t is advanced to t+1, and the procedure returns to step 1.

The goal of learning by the agent is to maximize the profit or to obtain policies for maximizing the profit. The profit refers to cumulative rewards obtained during a certain period, and the profit is represented by the sum of rewards in its simplest form. In reinforcement learning, the sum of discounted rewards is often adopted as the profit. The profit $G_t$ at a time t is defined by equation (1).

$$G_t = r_t + \gamma r_{t+1} + \gamma^2 r_{t+2} + \ldots = \sum_{k=0}^{\infty} \gamma^k r_{t+k} \quad (1)$$

Here, γ signifies the discount rate (0≤γ<1).

A state-value function represents the expected value of the profit Gt that is obtained when actions are determined successively from a state according to policies n and is expressed by $V^\pi(s)$. Furthermore, an action-value function takes actions as well as a state into account and is expressed by $Q^\pi(s, a)$.

The Bellman equation holds as a relationship that holds for two states s and s' to which transition is possible. The Bellman equation for a state-value function under certain policies n is expressed by equation (2).

$$V^\pi(s) = \sum_{a \in A(s)} \pi(a|s) \sum_{s' \in S} P(s'|s, a)(R(s, a, s') + \gamma V^\pi(s')) \quad (2)$$

Here, S signifies a set of states, and A(s) signifies a set of actions in a state s. n(a|s) signifies the probability that an action a is determined in the state s, P(s'|s, a) signifies the probability of transition to a state s' in the case where the action a is determined in the state s, and R(s, a, s') signifies the expected value of the reward that is obtained as a result of the transition to the state s' when the action a is determined in the state s.

The Bellman equation for an action-value function under certain policies n is expressed by equation (3).

$$Q^\pi(s, a) = \sum_{s' \in S} P(s'|s, a) \left( R(s, a, s') + \sum_{a' \in A(s')} \gamma \pi(a'|s') Q^\pi(s', a') \right) \quad (3)$$

Sarsa is a known example of an algorithm for solving the Bellman equation for an action-value function, expressed by equation (3) through experience by way of trial and error. As expressed by equation (4), Sarsa is a learning algorithm in which, in the case where a reward $r_{t+1}$ and a state $s_{t+1}$ to which a transition is to be made next are observed as a result of selecting an action $a_t$ in a state $s_t$, an action value $Q(s_t, a_t)$ is updated on the basis of an action $a_{t+1}$ that is selected in the state to which a transition is made after one time step.

$$Q(s_t, a_t) \leftarrow (1-\alpha)Q(s_t, a_t) + \alpha(r_{t+1} + \gamma Q(s_{t+1}, a_{t+1})) \quad (4)$$

The machine learning device 3 in this embodiment is configured to perform reinforcement learning by using a known algorithm, such as Sarsa described above, TD learning, Q learning, or the AC (Actor-Critic) method.

The machine learning device 3 includes a processor, a ROM (Read Only Memory), a main memory such as a RAM (Random Access Memory), a secondary storage device such as an HDD (Hard Disk Drive), an external interface for sending and receiving various data to and from external devices, etc., connected to each other via a bus, which are not shown. The processor is configured to realize the functions described below. The machine learning device 3 may be provided in a cell controller that controls the machining cell 2.

Figure 2:
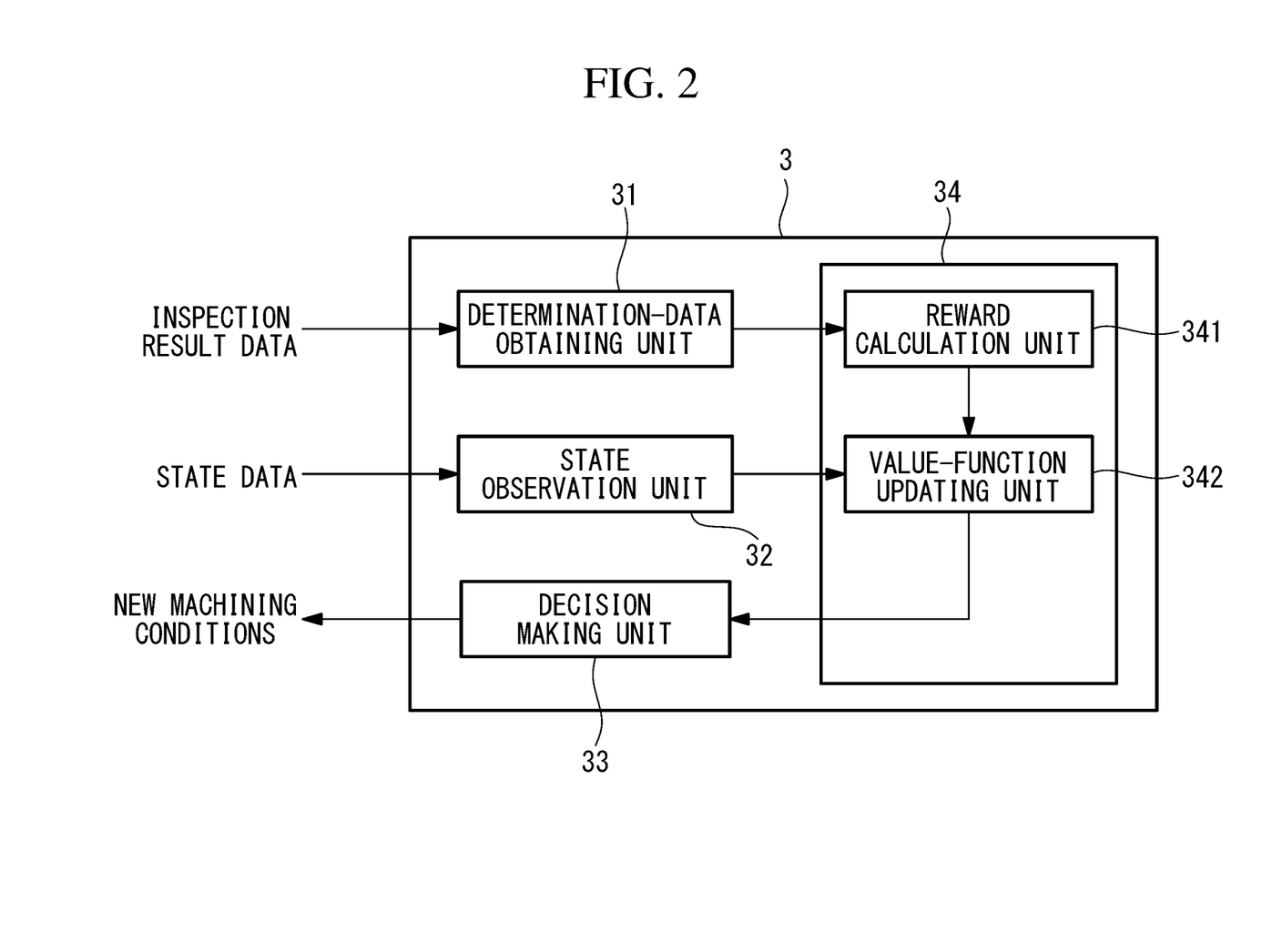
FIG. 2 is a block diagram schematically showing the configuration of a machine learning device included in the machining equipment system in FIG. 1.

From the viewpoint of functions, the machine learning device 3 includes a determination-data obtaining unit 31, a state observation unit 32, a decision making unit 33, and a learning unit 34, as shown in FIG. 2.

In the machine learning device 3, the determination-data obtaining unit 31 is connected to a reward calculation unit 341 included in the learning unit 34. The reward calculation unit 341 is connected to a value-function updating unit 342 included in the learning unit 34. The state observation unit 32 is connected to the value-function updating unit 342 included in the learning unit 34. The value-function updating unit 342 included in the learning unit 34 is connected to the decision making unit 33.

The determination-data obtaining unit 31 is configured to obtain inspection result data of a machined workpiece inspected by the inspection device 24 (see FIG. 1), i.e., a machining error of the machined workpiece and the result of good/defective determination of the workpiece.

The state observation unit 32 is configured to obtain state data representing the states of the milling equipment 21 during machining of a workpiece from the sensor 22 attached to the milling equipment 21 or the control device 23 that controls the milling equipment 21. The state data is obtained at predetermined intervals during machining of a workpiece and is stored in the form of a time series in a memory that is not shown. This state data may be processed as needed into a format that is suitable for use in the learning unit 34 at a subsequent stage.

The reward calculation unit 341 included in the learning unit 34 is configured to calculate a reward on the basis of the machining error of the machined workpiece and the result of good/defective determination of the workpiece, obtained by the determination-data obtaining unit 31.

The value-function updating unit 342 included in the learning unit 34 is configured to sequentially update the value functions on the basis of the reward calculated by the reward calculation unit 341 and the state data obtained by the state observation unit 32.

The decision making unit 33 is configured to determine actions, i.e., new machining conditions, on the basis of the value functions updated by the value-function updating unit 342 and to send the determined machining conditions to the control device 23.

The processing executed in the machine learning device 3 will be described below in further detail with reference to FIGS. 2 and 3.

Figure 3:
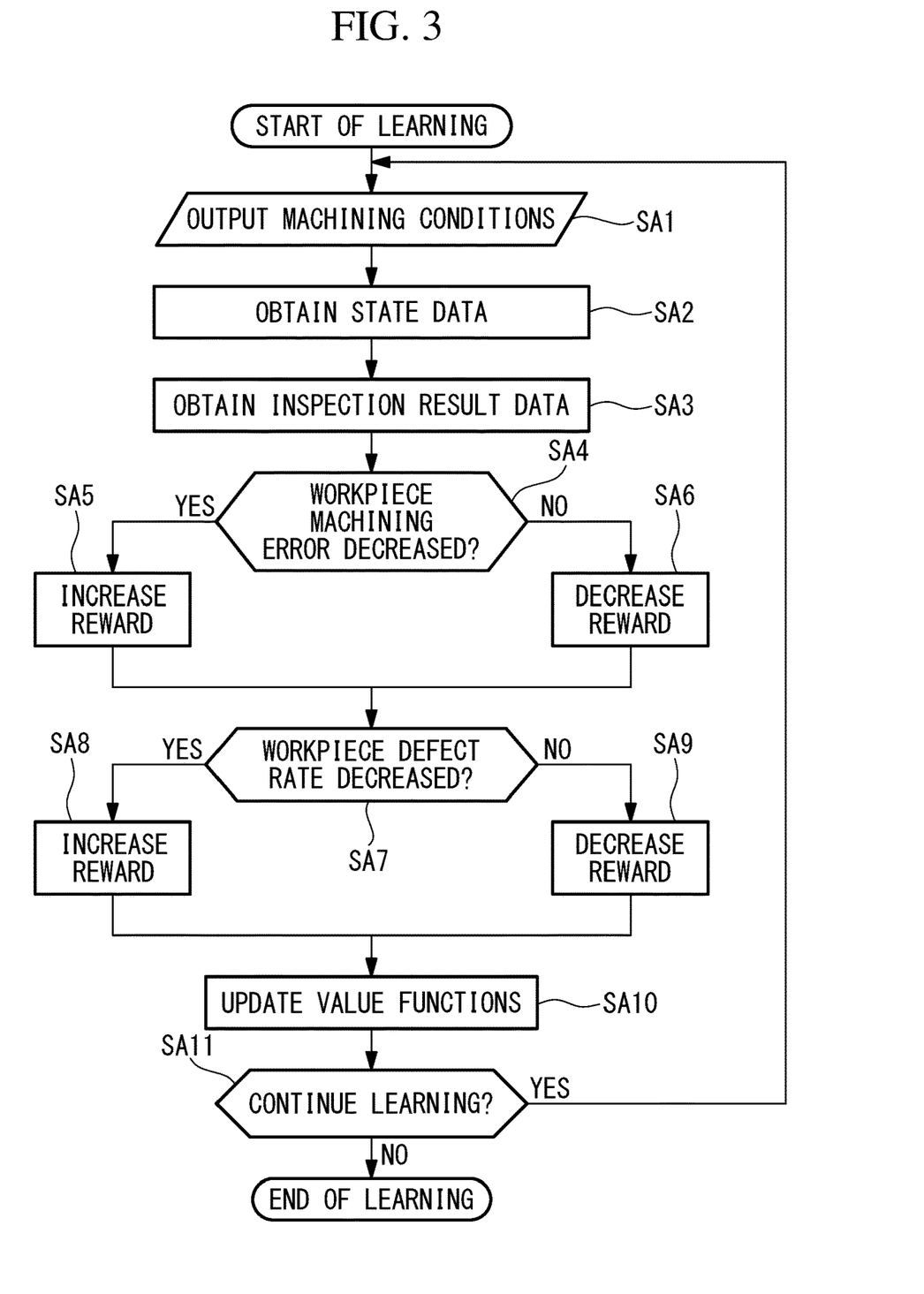
FIG. 3 is a flowchart showing processing that is executed in the machine learning device in FIG. 2.

First, the decision making unit 33 outputs determined machining conditions to the control device 23 (step SA1 in FIG. 3). In the case immediately after the start of learning, preset initial values are output as machining conditions. For example, initial values of the value functions may be set by performing batch learning in advance, and the initial values of the machining conditions may be determined accordingly.

In the machining cell 2, the control device 23 drives the milling equipment 21 on the basis of the machining conditions output from the decision making unit 33, whereby the workpiece is machined. The state data representing the states of the milling equipment 21 during machining of the workpiece is detected by the sensor 22 attached to the milling equipment 21 or is obtained from internal data saved in the control device 23. The state data is sent to the machine learning device 3 via the communication network 4 and is obtained by the state observation unit 32 (step SA2 in FIG. 3).

Meanwhile, the machined workpiece is inspected by the inspection device 24 in the machining cell 2. The inspection result data is sent to the machine learning device 3 via the communication network 4 and is obtained by the determination-data obtaining unit 31 (step SA3 in FIG. 3).

Then, the reward calculation unit 341 calculates a reward (steps SA4 to SA9 in FIG. 3).

First, the machining error of the workpiece, obtained by the determination-data obtaining unit 31 as the inspection result data, is compared with the machining error of the workpiece, obtained one time step before, to determine whether the value of the error has decreased (step SA4). The reward is increased in the case where the value of the error has decreased (step SA5), whereas the reward is decreased in the case where the value of the error is equal to the previous value or has increased (step SA6).

Then, the defect rate of the workpiece, obtained by the determination-data obtaining unit 31 as the inspection result data, is compared with the defect rate of the workpiece, obtained one time step before, to determine whether the defect rate has decreased (step SA7). The reward is increased in the case where the defect rate has decreased (step SA8), whereas the reward is decreased in the case where the defect rate is equal to the previous value or has increased (step SA9).

In the above determination, instead of comparing the current defect rate with the defect rate one time step before, the result of good/defective determination of the workpiece obtained as a result of the current inspection may be used as a criterion for the determination. In this case, the reward is increased when the workpiece is determined as being "good", and the reward is decreased when the workpiece is determined as being "defective".

Then, the value-function updating unit 342 updates the value functions on the basis of the reward calculated by the reward calculation unit 341 and the state data obtained by the state observation unit 32 (step SA10 in FIG. 3).

Finally, it is determined whether or not learning is to be continued (step SA11 in FIG. 3). In the case where learning is to be continued, the procedure returns to step SA1. Then, the decision making unit 33 outputs new machining conditions on the basis of the updated value functions, and then the processing in steps SA2 to SA11 is repeated. In the case where learning is not to be continued, the processing in the machine learning device 3 is terminated.

As described above, in this embodiment, the reward calculation unit 341 determines whether to increase or decrease the reward by using the above-described two-step criteria. Thus, even if the machining error of the workpiece increases from the machining error one time step before and thus the reward is decreased, it is possible to increase the reward in the case where the workpiece is not determined as being "defective". This makes it possible to prevent an increase in manufacturing costs due to increasing the machining accuracy to an unnecessarily high level.

In the case where the same kind of workpiece is machined in another machining equipment system that is different from the machining equipment system 1 described above, it is suitable to share the machining conditions and inspection results in the machining equipment system 1 with the other machining equipment system as learning data for machine learning. Alternatively, distributed learning may be performed while sharing the value functions between the machining equipment system 1 described above and the other machining equipment system.

This serves to improve the efficiency of learning.

Second Embodiment

A manufacturing system according to a second embodiment of the present invention will be described below in detail with reference to the drawings. Although milling equipment is given as an example of the machining equipment in the description of this embodiment, the machining equipment is not limited to milling equipment and may be an injection molding machine, an arc welding robot, or the like.

Figure 4:
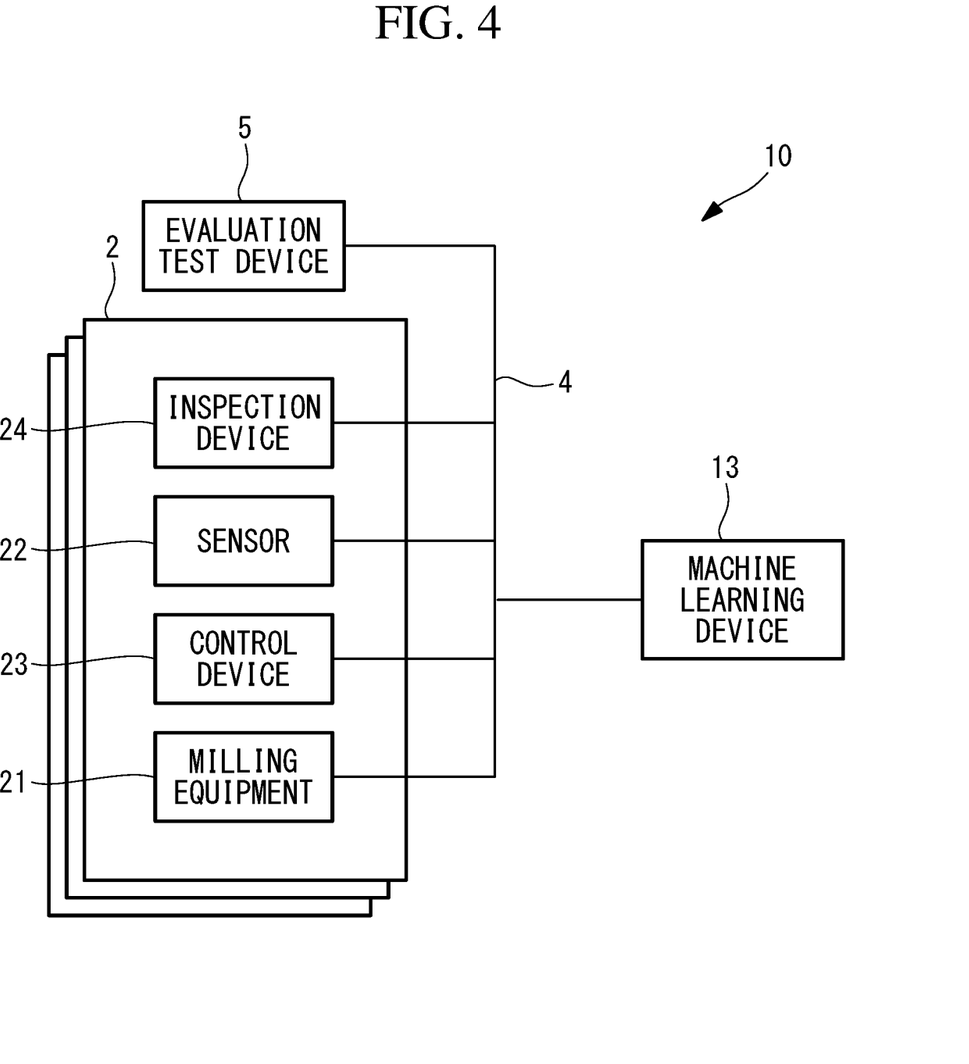
FIG. 4 is a block diagram schematically showing the configuration of a manufacturing system according to a second embodiment of the present invention.

As shown in FIG. 4, a manufacturing system 10 according to this embodiment includes a machining cell 2 including milling equipment (machining equipment) 21 for machining a workpiece, a control device 23 that controls the milling equipment 21, a sensor (state obtaining device) 22 that is attached to the milling equipment 21 and that obtains the states of the milling equipment 21, and an inspection device 24 for inspecting the workpiece after machining, and also includes an evaluation test device 5 and a machine learning device 13. Each of the milling equipment 21, the sensor 22, the control device 23, and the inspection device 24 included in the machining cell 2, as well as the evaluation test device 5, is connected to the machine learning device 13 via a communication network 4, such as an Ethernet (registered trademark) network or an FL-NET network.

The manufacturing system 10 may include a plurality of machining cells 2. The processing that is executed in the machining cells 2 is the same as that in the first embodiment described above, so that a description thereof will be omitted.

The evaluation test device 5 is configured to evaluate the performance of the workpiece as a final product. That is, in the case where a plurality of machining cells 2 are included, the evaluation test device 5 evaluates the performance of the machined workpiece after completion of machining of the workpiece in all the machining cells 2. The evaluation test should preferably be a non-destructive test.

Similarly to the machine learning device 3 in the first embodiment, the machine learning device 13 in this embodiment is configured to perform reinforcement learning and includes a processor, a main memory, a secondary storage device, an external interface, etc., which are not shown, and the processor is configured to realize the functions described below.

Figure 5:
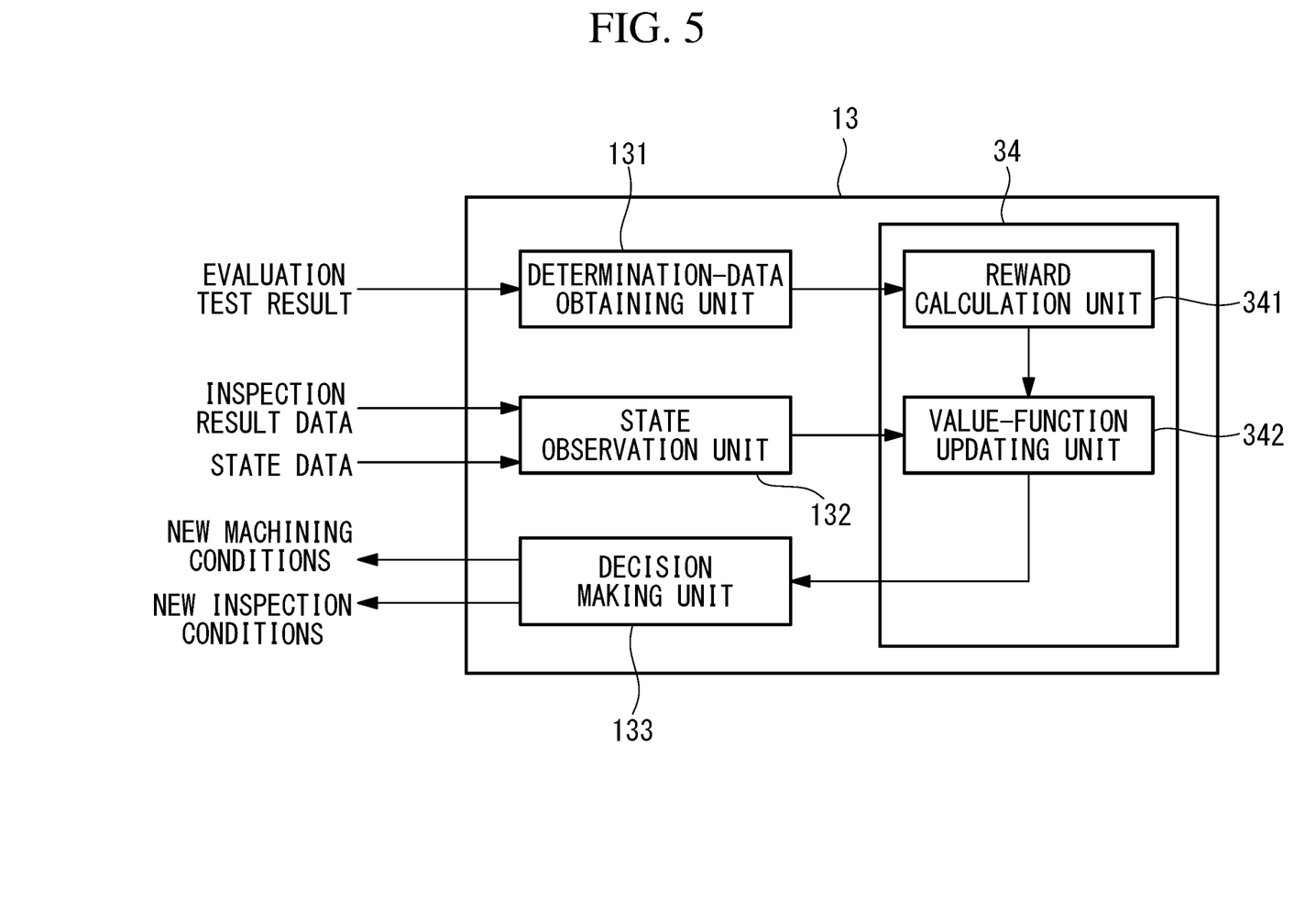
FIG. 5 is a block diagram schematically showing the configuration of a machine learning device included in the manufacturing system in FIG. 4.

From the viewpoint of functions, the machine learning device 13 includes a determination-data obtaining unit 131, a state observation unit 132, a decision making unit 133, and a learning unit 34, as shown in FIG. 5.

In the machine learning device 13, the determination-data obtaining unit 131 is connected to a reward calculation unit 341 included in the learning unit 34. The reward calculation unit 341 is connected to a value-function updating unit 342 included in the learning unit 34. The state observation unit 132 is connected to the value-function updating unit 342 included in the learning unit 34. The value-function updating unit 342 included in the learning unit 34 is connected to the decision making unit 133.

The determination-data obtaining unit 131 is configured to obtain an evaluation test result of a machined workpiece evaluated by the evaluation test device 5 (see FIG. 4).

The state observation unit 132 is configured to obtain state data representing the states of the milling equipment 21 during machining of a workpiece from the sensor 22 attached to the milling equipment 21 or the control device 23 that controls the milling equipment 21 and to obtain inspection result data from the inspection device 24. The state data is obtained at predetermined intervals during machining of a workpiece and is stored in the form of a time series in a memory that is not shown. This state data may be processed as needed into a format that is suitable for use in the learning unit 34 at a subsequent stage. The inspection result data also include information relating to the inspection condition (threshold) used for the good/defective determination in the inspection device 24.

The reward calculation unit 341 included in the learning unit 34 is configured to calculate a reward on the basis of the evaluation test result obtained by the determination-data obtaining unit 131.

The value-function updating unit 342 included in the learning unit 34 is configured to sequentially update the value functions on the basis of the reward calculated by the reward calculation unit 341, the state data and the inspection result data obtained by the state observation unit 132.

The decision making unit 133 is configured to determine actions, i.e., new machining conditions and new inspection conditions, on the basis of the value functions updated by the value-function updating unit 342 and to send the determined machining conditions to the control device 23 and the determined inspection conditions to the inspection device 24.

The processing in the machine learning device 13 will be described below in further detail with reference to FIGS. 5 and 6.

Figure 6:
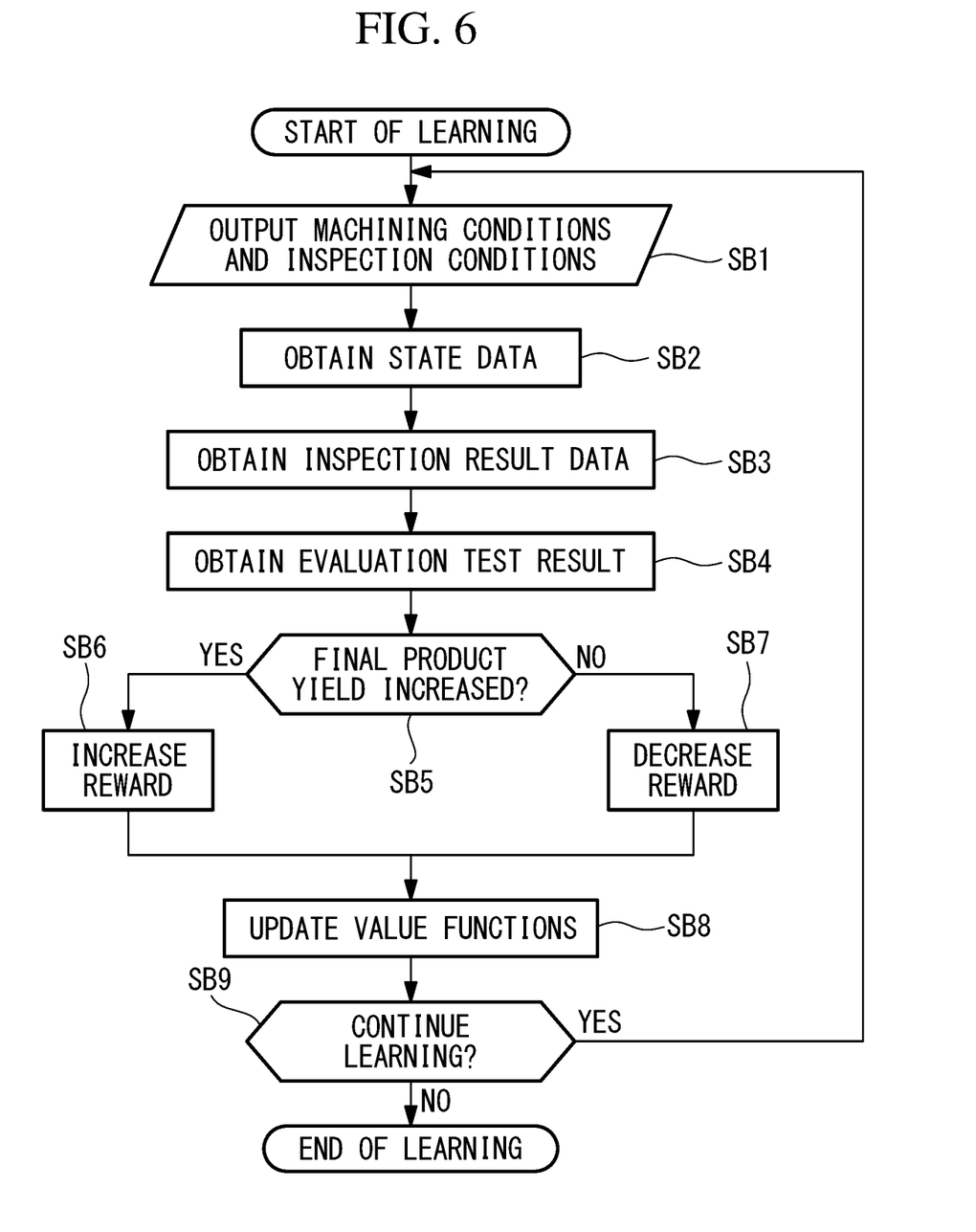
FIG. 6 is a flowchart showing processing that is executed in the machine learning device in FIG. 5.

First, the decision making unit 133 outputs determined machining conditions and inspection conditions to the control device 23 (step SB1 in FIG. 6). In the case immediately after the start of learning, preset initial values are individually output as machining conditions and inspection conditions.

Then, in the machining cell 2, the control device 23 drives the milling equipment 21 on the basis of the machining conditions output from the decision making unit 133, whereby the workpiece is machined. The state data representing the states of the milling equipment 21 during machining of the workpiece is detected by the sensor 22 attached to the milling equipment 21 or is obtained from internal data saved in the control device 23. The state data is sent to the machine learning device 13 via the communication network 4 and is obtained by the state observation unit 132 (step SB2 in FIG. 6). Meanwhile, the machined workpiece is inspected by the inspection device 24 on the basis of the inspection conditions output from the decision making unit 133. The inspection result data is sent to the machine learning device 13 via the communication network 4 and is obtained by the state observation unit 132 (step SB3 in FIG. 6).

Meanwhile, the machined workpiece after completion of all the machining steps is subjected to workpiece performance evaluation by the evaluation test device 5. The evaluation test result is sent to the machine learning device 13 via the communication network 4 and is obtained by the determination-data obtaining unit 131 (step SB4 in FIG. 6).

Then, the reward calculation unit 341 calculates a reward (steps SB5 to SB7 in FIG. 6). The evaluation test result obtained by the determination-data obtaining unit 131 is compared with the evaluation test result obtained one time step before to determine whether the yield of the final product has increased (step SB5). The reward is increased in the case where the yield of the workpiece serving as a final product has increased (step SB6), whereas the reward is decreased in the case where the yield of the workpiece serving as a final product is equal to the previous value or has decreased (step SB7).

In the above determination, instead of comparing the current yield with the yield one time step before, the result of good/defective determination of the workpiece obtained as a result of the current evaluation test may be used as a criterion for the determination. In this case, the reward is increased when the workpiece serving as a final product is determined as being "good", and the reward is decreased when the workpiece is determined as being "defective".

Then, the value-function updating unit 342 updates the value functions on the basis of the reward calculated by the reward calculation unit 341 and the state data and inspection result data obtained by the state observation unit 132 (step SB8 in FIG. 6).

Finally, it is determined whether or not learning is to be continued (step SB9 in FIG. 6). In the case where learning is to be continued, the procedure returns to step SB1. Then, the decision making unit 133 outputs new machining conditions and new inspection conditions on the basis of the updated value functions, and then the processing in steps SB2 to SB9 is repeated. In the case where learning is not to be continued, the processing in the machine learning device 13 is terminated.

As described above, in this embodiment, the reward calculation unit 341 calculates a reward on the basis of the evaluation test result of a workpiece serving as a final product. Furthermore, the state observation unit 132 obtains inspection conditions for the inspection device 24 as well as state data of the milling equipment 21. Furthermore, the value functions are updated on the basis of the state data of the milling equipment 21 and the inspection conditions for the inspection device 24, whereby new machining conditions and new inspection conditions are determined.

This makes it possible to determine optimal machining conditions and optimal inspection conditions on the basis of the result of the performance evaluation test of the workpiece serving as a final product, which serves to minimize the costs of the final product.

Although embodiments of the present invention have been described above in detail with reference to the drawings, specific configurations are not limited to these embodiments, and the present invention encompasses design modifications, etc. that do not depart from the scope of the present invention.

As a result, the above-described embodiments lead to the following aspects.

A first aspect of the present invention is a machining equipment system including machining equipment that performs machining of a workpiece; a control device that controls the machining equipment on the basis of a machining condition; a state obtaining device that obtains a state of the machining equipment during the machining; an inspection device that inspects the workpiece after the machining; and a machine learning device that performs machine learning on the basis of a result of inspection by the inspection device and the state of the machining equipment, obtained by the state obtaining device, wherein the machine learning device modifies the machining condition on the basis of a result of the machine learning so as to improve the machining accuracy of the workpiece or so as to minimize the defect rate of the workpiece.

With the machining equipment system according to this aspect, the control device controls the machining equipment that performs machining of a workpiece, and the state obtaining device obtains a state of the machining equipment during the machining. Meanwhile, the inspection device inspects the workpiece after the machining. Then, the machine learning device performs machine learning on the basis of the obtained state of the machining equipment and the inspection result of the workpiece and modifies the machining condition so as to improve the machining accuracy of the workpiece or so as to minimize the defect rate of the workpiece.

This makes it possible to prevent an increase in manufacturing costs due to increasing the machining accuracy to an unnecessarily high level.

In the machining equipment system according to the first aspect, each of the machining equipment, the control device, the state obtaining device, and the inspection device may be mutually connected to the machine learning device via a communication network.

A second aspect of the present invention is a manufacturing system including a plurality of machining equipment systems of the type described above, wherein, in the case where a workpiece of the same kind as the workpiece machined by one of the plurality of machining equipment systems is machined by another one of the plurality of machining equipment systems, the machining condition and the inspection result for the workpiece in the one machining equipment system are shared as learning data for the machine learning in the other machining equipment system.

This makes it possible to improve the efficiency of learning.

A third aspect of the present invention is a manufacturing system including machining equipment that performs machining of a workpiece; a control device that controls the machining equipment on the basis of a machining condition; a state obtaining device that obtains a state of the machining equipment during the machining and an inspection device that inspects the workpiece after the machining; an evaluation test device that conducts an evaluation test for the workpiece serving as a final product; and a machine learning device that performs machine learning on the basis of a result of the evaluation test by the evaluation test device, a result of inspection by the inspection device, and the state of the machining equipment, obtained by the state obtaining device, wherein the machine learning device modifies the machining condition and an inspection condition in the inspection device on the basis of a result of the machine learning so as to minimize costs of the final product.

With the machining equipment system according to the third aspect, the control device controls the machining equipment that performs machining of a workpiece, and the state obtaining device obtains a state of the machining equipment during the machining. Furthermore, the inspection device inspects the workpiece after the machining. Meanwhile, the evaluation test device conducts an evaluation test for the workpiece serving as a final product. Then, machine learning is performed on the basis of the result of the evaluation test by the evaluation test device, the result of the inspection by the inspection device, and the state of the machining equipment, and the machining condition and the inspection condition are modified so as to minimize the costs of the final product.

This makes it possible to determine an optimal machining condition and an optimal inspection condition on the basis of the result of a performance evaluation test of a workpiece serving as a final product, which makes it possible to minimize the costs of the final product.

In the manufacturing system according to the third aspect, each of the machining equipment, the control device, the state obtaining device, the inspection device, and the evaluation test device may be mutually connected to the machine learning device via a communication network.

According to the present invention, an advantage is afforded in that it is possible to minimize manufacturing costs while maintaining the quality of a machined workpiece.

The invention claimed is:

1. A machining equipment system comprising:
   machining equipment that performs machining of a workpiece;
   a control device that controls the machining equipment based on a machining condition;
   a state obtaining device that obtains a state of the machining equipment during the machining;
   an inspection device that inspects the workpiece after the machining; and
   a machine learning device that performs machine learning based on a result of an inspection by the inspection device and the state of the machining equipment, obtained by the state obtaining device, wherein the result of the inspection comprises a comparison of a machining error value associated with the workpiece and a machining error value associated with an immediately previous workpiece;
   wherein the machine learning device modifies the machining condition based on one of a result of the machine learning so as to improve the machining accuracy of the workpiece or to minimize the defect rate of the workpiece.

2. A machining equipment system according to claim 1, wherein each of the machining equipment, the control device, the state obtaining device, and the inspection device is mutually connected to the machine learning device via a communication network.

3. A manufacturing system comprising a plurality of machining equipment systems according to claim 1,
   wherein, in the case where a workpiece of the same kind as the workpiece machined by one of the plurality of machining equipment systems is machined by another one of the plurality of machining equipment systems, the machining condition and the inspection result for the workpiece in the one machining equipment system are shared as learning data for the machine learning in the other machining equipment system.

4. A manufacturing system comprising:
   machining equipment that performs machining of a workpiece;
   a control device that controls the machining equipment based on a machining condition;
   a state obtaining device that obtains a state of the machining equipment during the machining and an inspection device that inspects the workpiece after the machining;
   an evaluation test device that conducts an evaluation test for the workpiece serving as a final product; and
   a machine learning device that performs machine learning based on a result of the evaluation test by the evaluation test device, a result of inspection by the inspection device, and the state of the machining equipment, obtained by the state obtaining device,
   wherein the machine learning device modifies the machining condition and an inspection condition in the inspection device based on a result of the machine learning so as to minimize costs of the final product.

5. A manufacturing system according to claim 4, wherein each of the machining equipment, the control device, the state obtaining device, the inspection device, and the evaluation test device is mutually connected to the machine learning device via a communication network.

6. A machining equipment system comprising:
   machining equipment that performs machining of a workpiece;
   a control device that controls the machining equipment based on a machining condition;
   a state obtaining device that obtains a state of the machining equipment during the machining;
   an inspection device that inspects the workpiece after the machining; and
   a machine learning device that performs machine learning based on a result of inspection by the inspection device and the state of the machining equipment, obtained by the state obtaining device, wherein the result of the inspection comprises a comparison of a machining error value associated with the workpiece and a machining error value associated with an immediately previous workpiece;
   wherein the machine learning device modifies the machining condition based on a result of the machine learning so as to reduce or minimize the defect rate of the workpiece while maintaining the machining accuracy of the workpiece within a predetermined range.

* * * * *